(12) United States Patent
Park et al.

(10) Patent No.: US 12,488,982 B2
(45) Date of Patent: Dec. 2, 2025

(54) METHOD OF PROCESSING SUBSTRATE

(71) Applicant: TES Co., Ltd, Yongin-si (KR)

(72) Inventors: Joo-Hyun Park, Yongin-si (KR); Sang-Hak Yeo, Yongin-si (KR); Jae-Ho Lee, Yongin-si (KR); Jae-Young Yang, Yongin-si (KR); Kwan-Woo Lee, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 372 days.

(21) Appl. No.: 18/139,638

(22) Filed: Apr. 26, 2023

(65) Prior Publication Data
US 2023/0343585 A1 Oct. 26, 2023

(30) Foreign Application Priority Data

Apr. 26, 2022 (KR) .................. 10-2022-0051469

(51) Int. Cl.
*H01L 21/02* (2006.01)
*H01L 21/266* (2006.01)

(52) U.S. Cl.
CPC .. *H01L 21/02274* (2013.01); *H01L 21/02115* (2013.01); *H01L 21/266* (2013.01)

(58) Field of Classification Search
CPC ......... H01L 21/02274; H01L 21/02115; H01L 21/266; H01L 21/02205; H01L 21/0332; H01L 21/0337; H01L 21/02304
See application file for complete search history.

(56) References Cited

U.S. PATENT DOCUMENTS

| | | | |
|---|---|---|---|
| 8,110,493 B1 * | 2/2012 | Subramonium | H01L 21/02115 438/618 |
| 10,014,174 B2 | 7/2018 | Mebarki et al. | |
| 2014/0370711 A1 * | 12/2014 | Cheng | H01L 21/02118 438/702 |
| 2016/0365248 A1 * | 12/2016 | Mebarki | H01L 21/02118 |
| 2017/0278709 A1 | 9/2017 | Mebarki et al. | |

(Continued)

FOREIGN PATENT DOCUMENTS

| | | |
|---|---|---|
| KR | 10-0132594 B1 | 7/1997 |
| KR | 10-2011-0112728 A | 10/2011 |
| KR | 10-2013-0059791 A | 6/2013 |

(Continued)

OTHER PUBLICATIONS

Taiwanese Office Action for related TW Application No. 112115630 mailed Dec. 15, 2023 from Taiwan Intellectual Property Office.

(Continued)

*Primary Examiner* — Victor A Mandala
(74) *Attorney, Agent, or Firm* — Paratus Law Group, PLLC

(57) ABSTRACT

There is provided a method of processing a substrate that protects the photoresist pattern during the subsequent ion implanting process as well as improve the conformal properties. The method of processing the substrate includes steps of disposing a substrate in a reaction chamber, the substrate on which a photoresist pattern is formed; and forming a CD control film including a nitrogen-doped amorphous carbon on the substrate on which the photoresist pattern is formed, and the step of forming the CD control film may be performed at a temperature of 100° C. or less by a PECVD process.

7 Claims, 9 Drawing Sheets

(56) References Cited

U.S. PATENT DOCUMENTS

2019/0385845 A1   12/2019   Manna et al.

FOREIGN PATENT DOCUMENTS

| KR | 10-2015-0131165 A | 11/2015 |
| KR | 10-2017-0041847 A | 4/2017 |
| KR | 10-2020-0002519 A | 1/2020 |
| KR | 10-2020-0105531 A | 9/2020 |
| TW | I381427 B | 1/2013 |
| TW | 202034384 A | 9/2020 |

OTHER PUBLICATIONS

Korean Office Action for related KR Application No. 10-2022-0051469 mailed Jul. 18, 2024 from Korean Intellectual Property Office.
Korean Notice of Allowance for related KR Application No. 10-2022-0051469 mailed May 14, 2025 from Korean Intellectual Property Office.

* cited by examiner

FIG. 1
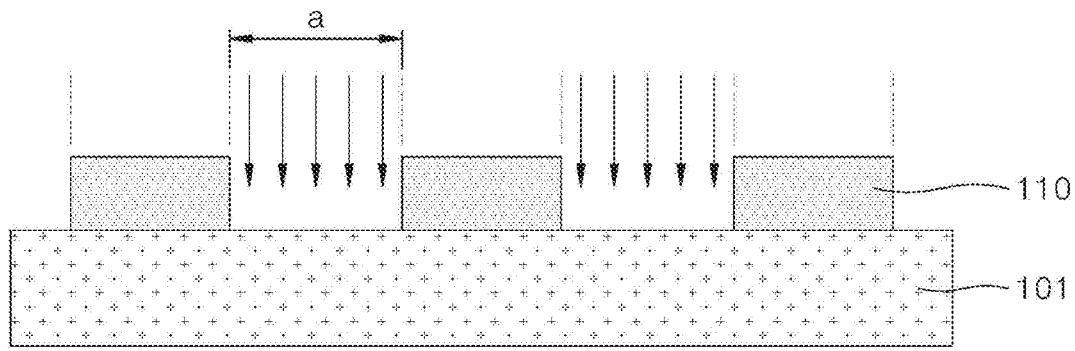
FIG. 2
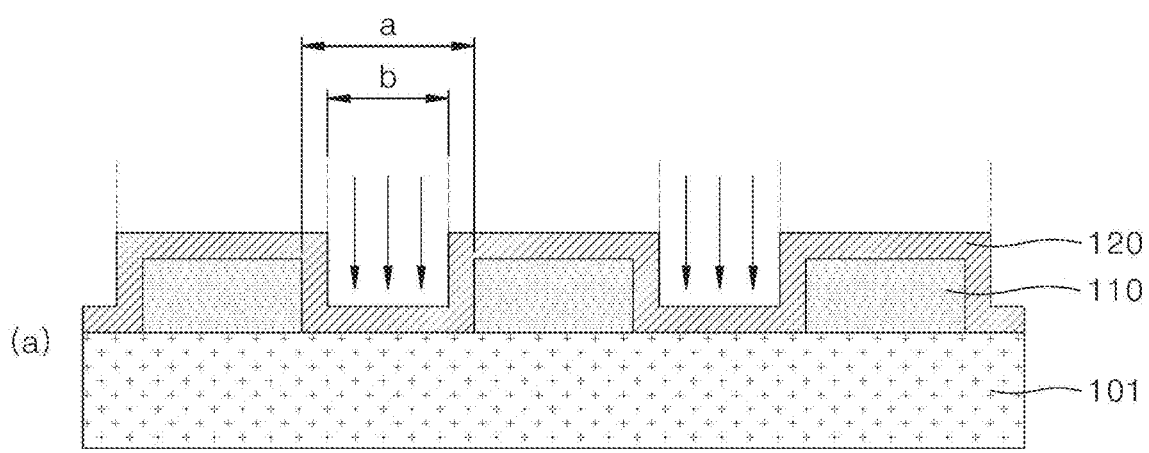
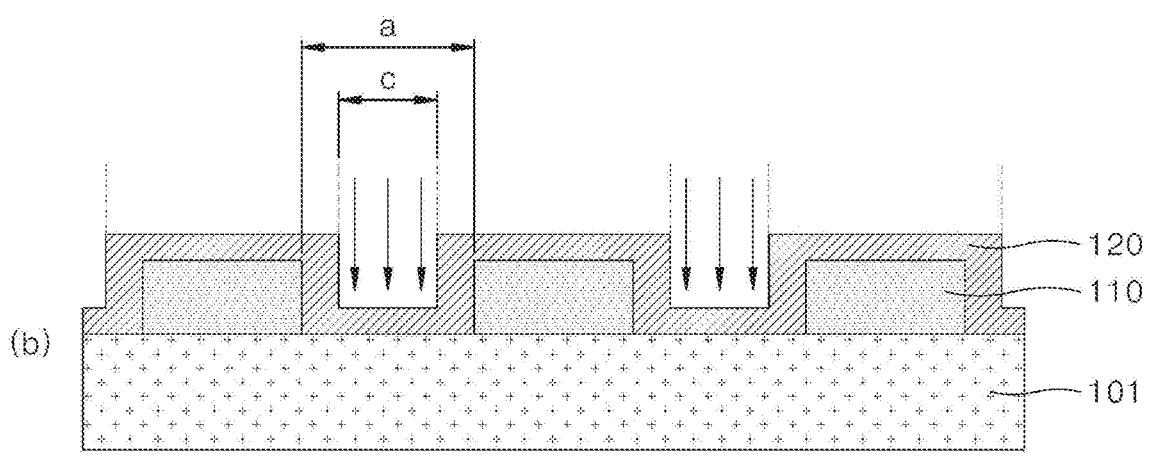

FIG. 5
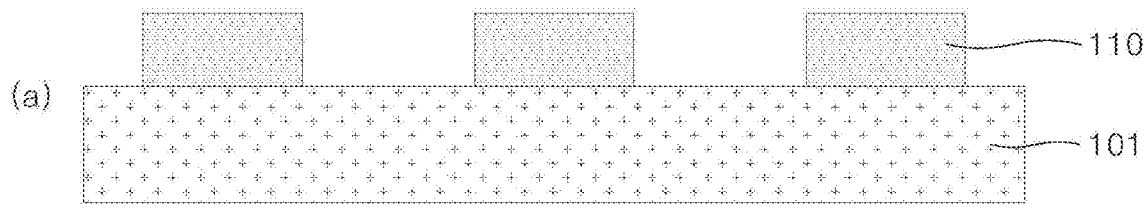
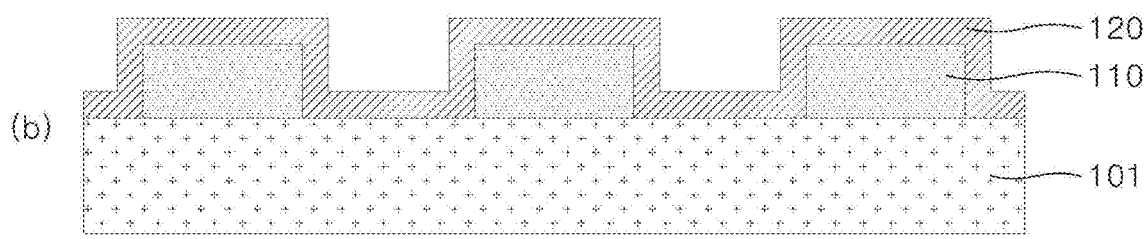
FIG. 6
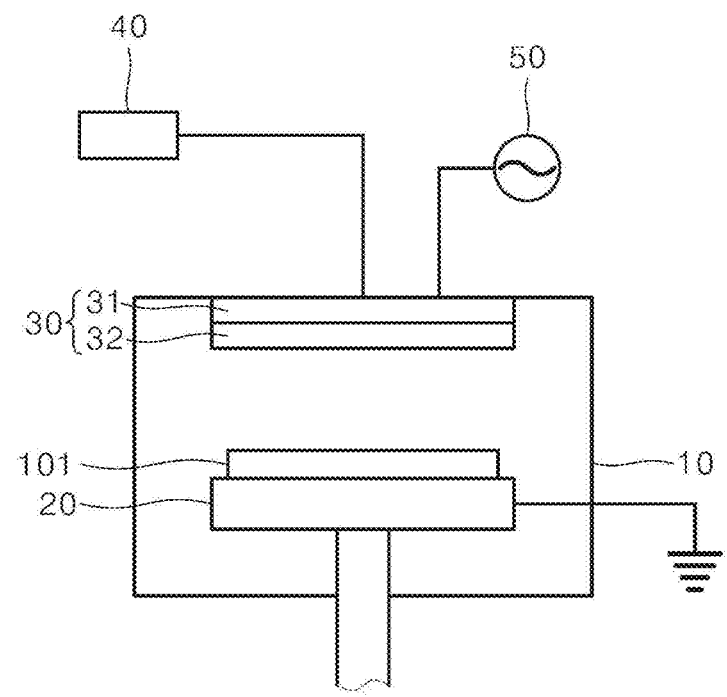

FIG. 8
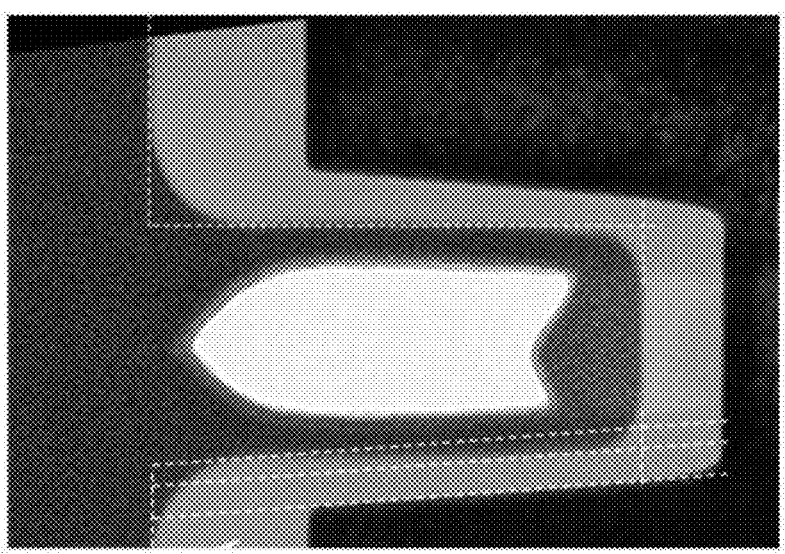
(a)
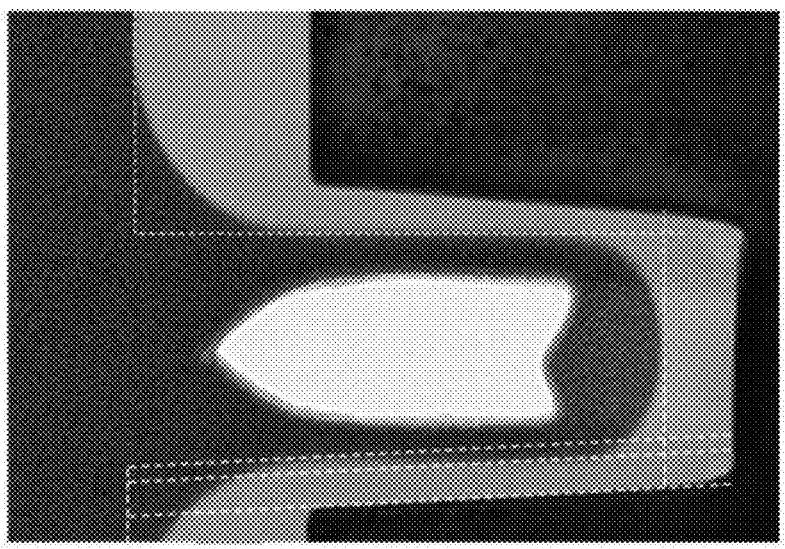
(b)
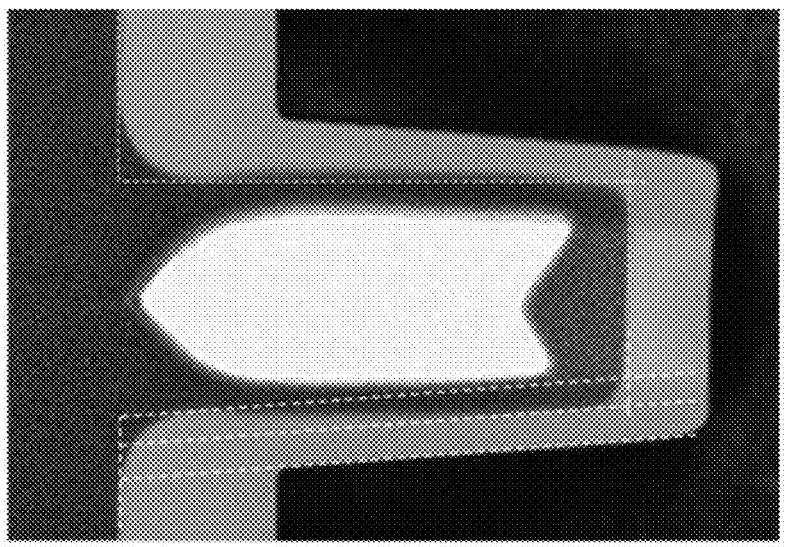
(c)

METHOD OF PROCESSING SUBSTRATE

CROSS-REFERENCE TO RELATED APPLICATION

This application claims priority to Korean Patent Application No. 10-2022-0051469 (filed on Apr. 26, 2022), which is hereby incorporated by reference in its entirety.

BACKGROUND

The present disclosure relates to a method of processing a substrate using a CD adjusting film of a photoresist pattern when processing a substrate on which a photoresist pattern is formed.

In a semiconductor device manufacturing process, photolithography technology is used to implant ions into a substrate, to form a circuit pattern, to form an insulating pattern and the like. The photolithography is a technique that forms a photoresist film on a substrate and then a photoresist pattern from the photoresist film through exposure and development process. The photoresist pattern is used as a mask for sequent processes such as an ion implanting process and an etching process.

However, in many cases, it become difficult to control a Critical Dimension (hereinafter, CD) only with the photoresist pattern due to increasingly miniaturized patterns and resolution limitations in the photolithograph process.

For such pattern miniaturization, a method of forming a CD control film in addition to the photoresist pattern is widely used. In the process using the CD control film, the important thing for CD control is to form the most conformal CD control film.

However, it is difficult in a conventional DC control film forming process to achieve a conformal CD control film due to an overhang, a footing, and deposition defects in a side of photoresist pattern.

SUMMARY

Accordingly, one objective of the present disclosure is invented to solve the above-noted disadvantages of the prior art, and to provide a method of processing a substrate on which a photoresist pattern is formed, which may improve conformal characteristics of a CD control film and protect a photoresist pattern simultaneously.

Another objective of the present disclosure is to provide a method of processing a substrate that may minimize the time that a photoresist pattern is exposed to plasma when forming a CD control film.

A method of processing a substrate according to an embodiment of the present disclosure may include steps of disposing a substrate in a reaction chamber, the substrate on which a photoresist pattern is formed; and forming a CD control film including a nitrogen-doped amorphous carbon on the substrate on which the photoresist pattern is formed. the step of forming the CD control film may be performed at a temperature of 100° C. or less by a PECVD process.

The step of forming the CD control film may be performed from 75° C. to 100° C.

In the step of forming the CD control film, a liquid precursor containing carbon and nitrogen may be vaporized and supplied to the reaction chamber.

The subsequent process is an ion implanting process. The ion implanting process may be performed in a state where the CD control film remains in an ion implanting region.

The CD control film and the photoresist pattern may be collectively removed.

In another aspect of the present disclosure, a method of processing a substrate according to another embodiment may include disposing a substrate in a reaction chamber, the substrate on which a photoresist pattern is formed; forming a seed layer on the substrate on which the photoresist pattern is formed; and forming a CD control film including a nitrogen-doped amorphous carbon on the seed layer.

The method of processing the substrate may further include a step of etching the seed layer to make the thickness of the seed layer thinner, before forming the CD control film.

The seed layer may be formed at a temperature of 100 or less by a PECVD process.

A plasma power applied in the step of forming the seed layer may be lower than a plasma power applied in the step of forming the CD control film.

In the step of forming the seed layer and the step of forming the CD control film, a liquid precursor containing carbon and nitrogen may be vaporized and supplied to the reaction chamber.

A method of processing a substrate according to a further embodiment of the present disclosure may include steps of disposing a substrate in a reaction chamber, the substrate on which a photoresist pattern is formed; and forming a CD control film including a nitrogen-doped amorphous carbon on the substrate on which the photoresist pattern is formed. the step of forming the CD control film may be performed at a temperature of 100° C. or less by a PECVD process. the step of forming the CD control film may be performed at a temperature of 100° C. or less by a PECVD process.

The step of forming the CD control film may be performed from 75° C. to 100° C.

In the step of forming the CD control film, a liquid precursor containing carbon and nitrogen may be vaporized and supplied to the reaction chamber.

A method of processing a substrate according to a still further embodiment of the present disclosure may include steps of disposing a substrate in a reaction chamber, the substrate on which a photoresist pattern is formed; forming a seed layer on the substrate on which the photoresist pattern is formed; and forming a CD control film including a nitrogen-doped amorphous carbon on the seed layer. The step of forming the seed layer and the step of forming the CD control film may be performed at a temperature of 100° C. or less by a PECVD process.

The method of processing the substrate may further include a step of etching the seed layer to make the thickness of the seed layer thinner.

The seed layer may be made of the same material as the CD control film.

In the step of forming the seed layer and the step of forming the CD control film, a liquid precursor containing carbon and nitrogen may be vaporized and supplied to the reaction chamber.

A plasma power applied in the step of forming the seed layer may be lower than a plasma power applied in the step of forming the CD control film.

According to the method of processing the substrate, the conformal properties of the CD control film may be improved by the PECVD process performed at the low temperature of 100 or less and using the liquid precursor. Also, since the CD control film covers the upper surface and the lateral surfaces of the photoresist pattern, the photoresist pattern may be sufficiently protected during the subsequent process such as the ion implanting.

In addition, according to the method of processing the substrate, the seed layer may be formed with a thin thickness of about several nanometers before the CD control film is formed. Accordingly, the conformal properties of the CD control film may be additionally improved. In this instance, the exposure time of the photoresist pattern to plasma may be minimized. Accordingly, damage to the photoresist pattern may be reduced.

In addition to the above-described effects, specific effects of the present invention will be described together with the following detailed description for implementing the present invention.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings.

FIG. 1 is a view showing CD in a state where only a photoresist pattern is formed.

FIG. 2 is a view showing CD in a state where a CD control film is additionally formed on the photoresist pattern.

FIG. 5 shows an embodiment of forming a CD control film in a method of processing a substrate according to the present disclosure.

FIG. 6 schematically shows an example of a apparatus that may be used in a process of disposing a CD control film.

FIG. 8 is TEM images showing step coverage and conformal characteristics based on a plasma power.

DETAILED DESCRIPTION

Figure 3:
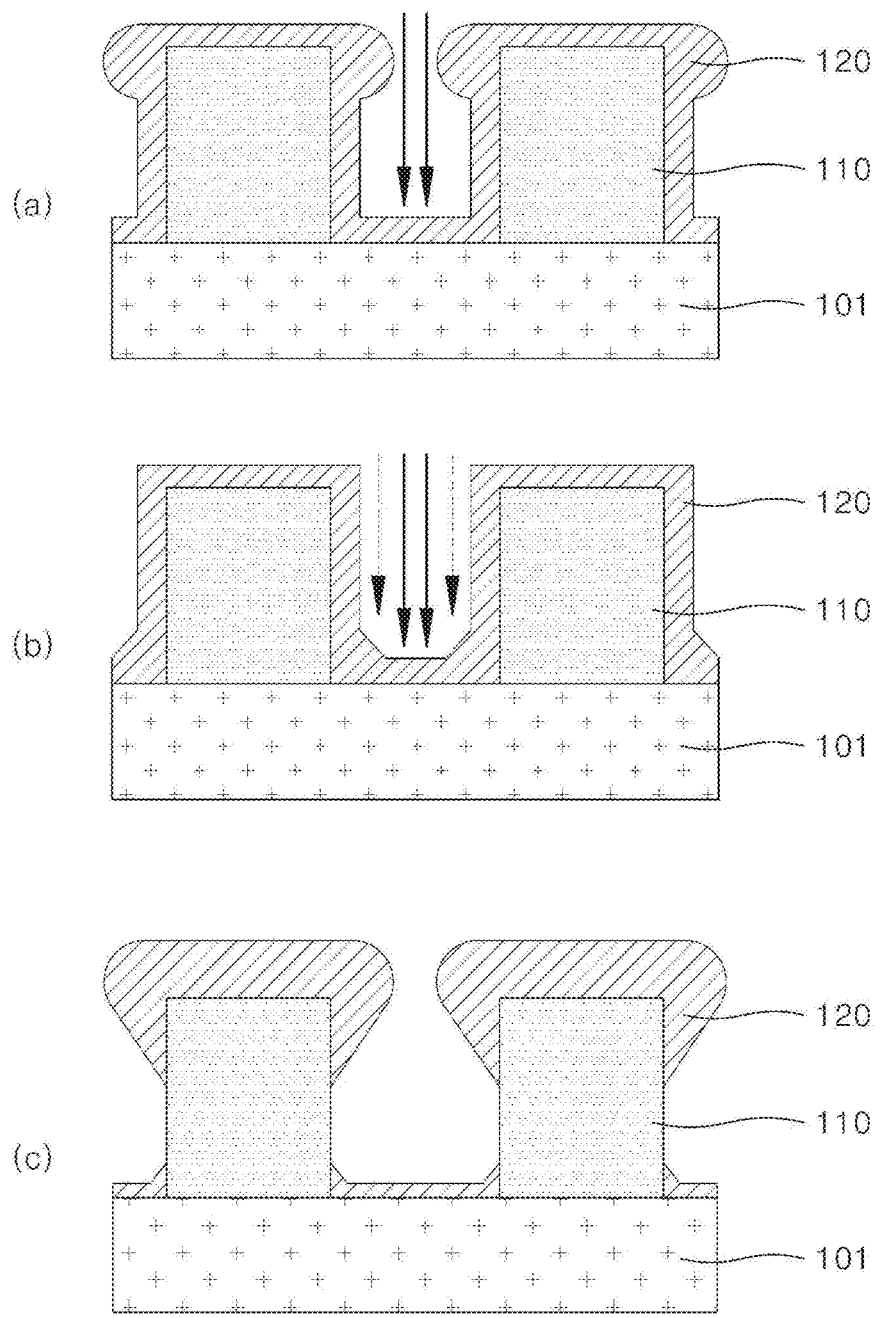
FIG. 3 schematically shows (a) a defect of a CD control film at an upper end of the photoresist pattern, (b) a defect of a CD control film at a lower end of the photoresist pattern, (c) a defect of a CD control film at a side of the photoresist pattern.

The present disclosure is not intended to limit the embodiments and drawings set forth herein, and numerous other modifications and embodiments can be devised. Regardless of numeral references, the same or equivalent components may be provided with the same reference numbers and description thereof will not be repeated. For the sake of brief description with reference to the drawings, the sizes and profiles of the elements illustrated in the accompanying drawings may be exaggerated or reduced and it should be understood that the embodiments presented herein are not limited by the accompanying drawings.

Hereinafter, expressions of 'a component is provided or disposed in an upper or lower portion' may mean that the component is provided or disposed in contact with an upper surface or a lower surface. The present disclosure is not intended to limit that other elements are provided between the components and on the component or beneath the component. It will be understood that when an element is referred to as being "connected with" another element, the element can be directly connected with the other element or intervening elements may also be present. In contrast, when an element is referred to as being "directly connected with" another element, there are no intervening elements present.

Hereinafter, expressions of 'a component is provided or disposed in an upper or lower portion' may mean that the component is provided or disposed in contact with an upper surface or a lower surface. The present disclosure is not intended to limit that other elements are provided between the components and on the component or beneath the component. Spatially relative terms may be understood as terms including different orientations of the device during use or operation in addition to the orientation shown in the drawings. For example, when an element shown in the drawings is turned over, an element described as "below" may be placed "above" another element. Accordingly, the exemplary term "below" may include both directions below and above.

It will be understood that although the terms used in the disclosure may be used herein to describe various embodiments, and the embodiments should not be limited by these terms. A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Hereinafter, referring to the accompanying drawings, a method of processing a substrate according to exemplary embodiments of the present disclosure will be described in detail.

'Critical Dimension (i.e., CD)' disclosed herewith means the smallest pattern width or minimum line width that may be realized by a photolithography process or the like. The smaller the CD is, the finer the pattern may be obtained.

FIG. 1 is a view showing CD in a state where only a photoresist pattern is formed.

Referring to FIG. 1, CD is defined as an arrow 'a' in a state where only a photoresist pattern 110 is formed on a substrate 101, which is determined by a distance between the photoresist patterns 110.

As the required pattern becomes more and more refined, a CD is required to be smaller. However, due to resolution limitations in a photolithograph process for forming the photoresist pattern, it is difficult to achieve a low CD only with the photoresist pattern.

As shown in FIG. 1, when an ion implanting process is performed without a CD control film, there is a problem in that the photoresist pattern is damaged by an accelerated ion beam. As the process time or a plasma power increase, the photoresist pattern could be more damaged.

FIG. 2 is a view showing CD in a state where a CD control film is additionally formed on the photoresist pattern. FIG. 2(*a*) is an example in which a horizontal portion and a vertical portion of the CD control film have the same thickness. FIG. 2(*b*) is an example in which the thickness of the horizontal portion of the CD control film is smaller than that of the vertical portion.

As shown in (a) and (b) of FIG. 2, CD is defined by arrow 'b' or arrow 'c' in a state where the CD control film 120 is formed, which is determined by the thickness of the CD control film together with the distance between the photoresist patterns 110 disposed on the substrate. The CD may be controlled to be a smaller value by using the CD control film 120 as shown in (a) or (b) of FIG. 2. However, it is difficult to achieve the low CD only with the photoresist pattern due to resolution limitations during the photolithograph process for forming the photoresist pattern.

In addition, when an ion implanting process is performed after the CD control film is formed, the ion implanting process may be performed in a state where the CD control film covers an upper surface and lateral surfaces of the photoresist pattern 110. At this time, damage to the photoresist pattern 110 may be suppressed, compared to the case otherwise.

FIG. 3 schematically shows (a) a defect of a CD control film (i.e., overhang) at an upper end of the photoresist pattern, (b) a defect of a CD control film (i.e., footing) at a lower end of the photoresist pattern, (c) a defect of a CD control film (i.e., unconformal) at a side of the photoresist pattern.

An amorphous carbon film may be considered as the CD control film. Generally, an amorphous carbon film is formed at a temperature of about 200° C. by a PECVD method using a precursor that is in a gaseous state at room temperature such as $C_2H_2$. This may be seen as considering an effect of densification due to fast mobility of gaseous precursor and a high temperature process. However, in this instance, defects in the CD control film could occur as shown in the examples of FIG. 3.

First, as shown in (a) of FIG. 3, a CD control film defect (i.e., overhang effect) may occur at an upper end of the photoresist pattern. In this instance, there is a possibility that the process may be performed only in a narrow area than a desired process area in a subsequent process. Next, as shown in (b) of FIG. 3, a CD control film defect (i.e., footing effect) may occur at a lower end of the photoresist pattern. In this instance as well, there is a possibility that the process may be performed only in a narrow area than a desired process area in a subsequent process. Last, as shown in (c) of FIG. 3, a CD control film defect (i.e., unconformal) may occur at a side of the photoresist pattern. In this instance, a lateral surface of the photoresist pattern is exposed so that there may be a possibility of damage to the photoresist pattern in a subsequent process.

Figure 4:
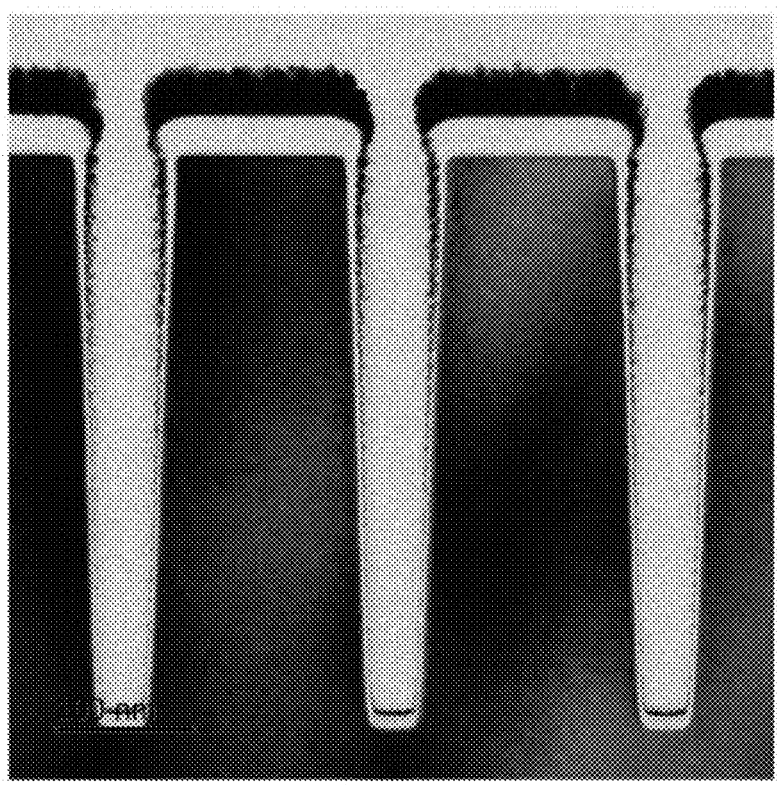
FIG. 4 is a TEM image when a CD control film is formed using a gaseous precursor.

FIG. 4 is a TEM image when a CD control film is formed using a gaseous precursor.

Referring to FIG. 4, as a result of forming the CD control film by the PECVD process using the gaseous precursor $C_2H_2$, there is a defect that the CD control film is excessively deposited on the upper end of the photoresist pattern and a defect that the CD control film is hardly deposited on the lateral surface of the photoresist pattern.

FIG. 5 shows an embodiment of forming a CD control film in a method of processing a substrate according to the present disclosure.

The method of processing the substrate according to the present disclosure may include a photoresist pattern forming step, a CD control film forming step, a sequent process step such as ion implanting, and a CD control film and photoresist pattern removing step. FIG. 5 schematically shows the photoresist pattern forming step and the CD control film forming step.

First, as shown in FIG. 5(a), the photoresist pattern 110 may be formed on the substrate 101. The substrate 101 may be made of a material such as silicon. Layers such as silicon oxide and silicon nitride may be formed on a surface of the substrate 101. The photoresist pattern 110 may be formed through exposure and development process after forming the photoresist film on the substrate 101.

After that, as shown in FIG. 5(b), the CD control film 120 may be formed on the substrate 101 on which the photoresist pattern 110 is formed. the CD control film 120 according to the present disclosure may be formed by PECVD method at a temperature of 100° C. or lower.

Preferably, a liquid precursor containing carbon and nitrogen may be vaporized and the CD control film according to the present disclosure may be formed of a nitrogen-doped amorphous carbon on the substrate by PECVD at a temperature of 100 or less from the vaporized liquid precursor.

The liquid precursor containing carbon and nitrogen may be liquidized at room temperature, and imide-based compounds, amide-based compounds and the like containing nitrogen with carbon may be used as the liquid precursor. Such the liquid precursor containing carbon and nitrogen may exhibit hydrophilicity due to functional groups containing carbon (e.g., —CHN, —N=C=N—), and it may enhance chemical adsorption for the lateral surface of the photoresist pattern and helps to improve step coverage and conformal properties of the CD control film.

The vaporized liquid precursor may be supplied together with an inert gas as carrier gas to reinforce low mobility.

The PECVD process at a low temperature and the formation of the CD control film using the liquid precursor may give a surface modification effect of the photoresist pattern, which results in improved conformal properties of the CD control film. In other words, according to the method of processing the substrate, as shown in (b) of FIG. 5, the CD control film may be conformally formed. The photoresist pattern may be protected in a subsequent process by the presence of such the CD control film.

The subsequent process may be performed after the CD control film is formed.

When the subsequent process is a deposition process, a substrate exposure step of exposing the substrate by removing the CD control film of a process target area may be further provided.

When the subsequent process is an ion implanting process, the CD control film in the process target area may be removed. However, it is preferred to perform the ion implanting process in a state where the CD control film of the process target area remains. In the ion planting process, it may be applied that the amount of the implanted ions and the implanting depth of the ion may be controlled by controlling dose and energy. When it is applied, the ion implanting process may be performed even in a state where the CD control film remains.

After the subsequent process is performed, the CD control film and the photoresist pattern may be removed. In a strip process for removing the photoresist pattern, the CD control film made of amorphous carbon may be collectively removed together with the photoresist pattern.

FIG. 6 schematically shows an example of a apparatus that may be used in a process of disposing a CD control film.

Referring to FIG. 6, the PECVD deposition device shown in the drawing may include a reaction chamber 10, a susceptor 20, a showerhead 30, a gas supply source 40 and an RF power source 50.

The susceptor 20 may be provided in a lower area inside the reaction chamber 10, and the showerhead 30 may be provided in an upper area inside the reaction chamber 10.

The substrate 101 on which the photoresist pattern is formed may be provided on the susceptor 20 as a deposition target. The susceptor 20 may be provided with a temperature control means such as a heating wire or a cooling water line. The susceptor 20 may be connected to a ground.

The showerhead 30 may be disposed in an upper area inside the chamber 10. The showerhead 30 may be configured to distribute and supply a reaction gas to the inside of the chamber 10. In addition, the showerhead 30 may serve as a RF electrode to form plasma in a space between the showerhead 30 and the susceptor 20 or inside the showerhead 30. In addition, in case plasma is formed inside the showerhead 30, an upper portion 31 of the showerhead 30 may be connected to the RF power source 50 to function as a RF electrode. Meanwhile, a lower portion 32 of the showerhead may be connected to the ground to function as a ground electrode.

The gas supply source 40 may be provided outside the reaction chamber 10 and configured to vaporize the liquid precursor and supply the vaporized precursor to the inside of the chamber 10. The liquid precursor may be vaporized by using an instantaneous vaporizer or a bubbler. Unlike being in a gaseous state from the beginning, the vaporized liquid precursor may have a low moving speed. To compensate for this, an inert gas as a carrier gas may be supplied to the inside of the chamber together with the vaporized liquid precursor. For example, flow rates of 600 to 1200 sccm of the vaporized precursor and 600 to 1200 sccm of an argon gas may be applied.

To process the substrate, a plurality gases including a fluorine-containing gas may be provided into the chamber 10 from a plurality of gas supply sources 40 through the showerhead 30. A flow controller for controlling the flow rate of each gas may be provided between the plurality of gas supply sources 40 and the chamber 10. The plurality of gases may be pre-mixed outside the chamber and supplied to the showerhead 30, or mixed inside the showerhead 30.

The RF power supply source 50 may apply power having a predetermined RF frequency (e.g., 13.56 MHz). After a plasma ignition gas is supplied to the inside of the chamber 10, for example, the inside of the showerhead, RF power (e.g., high-frequency power) having a predetermined RF frequency may be applied to the upper portion 31 of the showerhead 30 serving as the electrode in order to form plasma inside the showerhead 30. Forming plasma may also be referred to as conversion of the precursor supplied to the chamber into a plasma state, that is, plasmatizing.

When the liquid precursor containing carbon and nitrogen is vaporized and introduced into a CCP type PECVD deposition chamber of FIG. 8 together with, for example, helium gas, carbon radicals may be produced by RF power having an RF frequency of 13.56 MHz, then the CD control film including amorphous carbon doped with nitrogen may be formed on the surface of the substrate.

Process conditions for the CD control film deposition process may be shown in Table 1, for example.

TABLE 1

| Process variable range | |
| --- | --- |
| Temp | ≤100° C. |
| Pressure | 3~9 Torr |
| RF PWR | 150~1000 W |
| Space | 300~500 mils |
| Precursor | 600~1200 sccm |
| Ar Gas | 600~1200 sccm |
| N₂ Gas | 0~1500 sccm |

The CD control film forming step may be performed at room temperature to 100° C., preferably, from 50° C. to 100° C. and more preferably from 75° C. to 100° C. When the temperature for forming the CD control film is excessively low, conformal properties of the CD control film may deteriorate. In contrast, when the temperature for forming the CD control film exceeds 100, the photoresist pattern may be damaged during the formation of the CD control film by the PECVD process.

Figure 7:
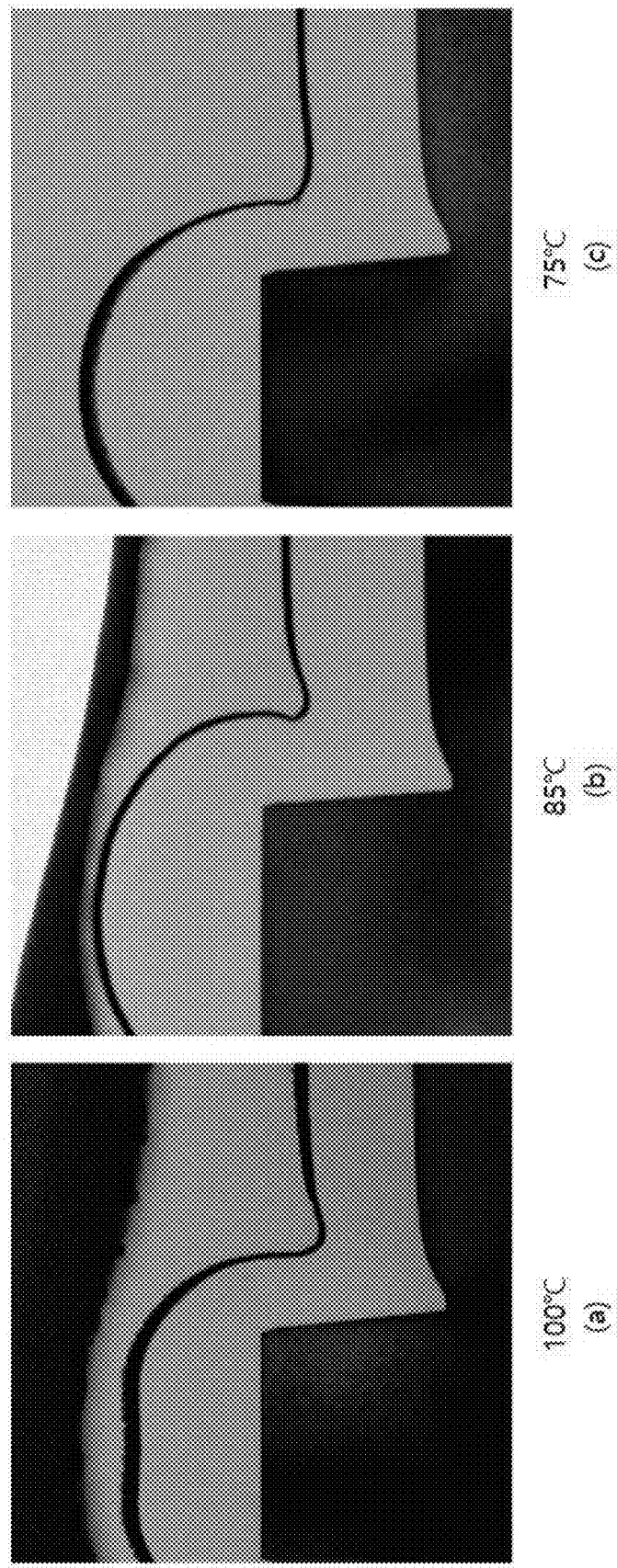
FIG. 7 is TEM images when a CD control film is formed in a PECVD process at (a) 100° C., (b) 85° C. and (c) 75° C.

FIG. 7 is TEM images when a CD control film is formed in a PECVD process at (a) 100° C., (b) 85° C. and (c) 75° C.

Referring to FIG. 7, it is shown that good conformal properties of the CD control film are exhibited when the CD control film was formed by PECVD process at 75° C., 85° C. and 100° C. On the other hand, referring to FIG. 7, it is shown that the CD control film is formed in a shape more similar to the photoresist pattern when the CD control film is formed at 100° C., that is, at a high temperature compared to be formed at 75° C. However, as described above, in terms of suppressing damage to the photoresist pattern, it is preferred to form the CD control film at 100° C. or less by the PECVD process. Taken together, it is preferred that the CD control film forming step is performed in the PECVD process from 75° C. to 100° C.

FIG. 8 is TEM images showing step coverage and conformal characteristics based on a plasma power. Specifically, different plasma powers (e.g., (a) 300 W, (b) 450 W and (c) 600 W) are applied, and the same process temperature, 85° C. is applied to three samples.

Figure 9:
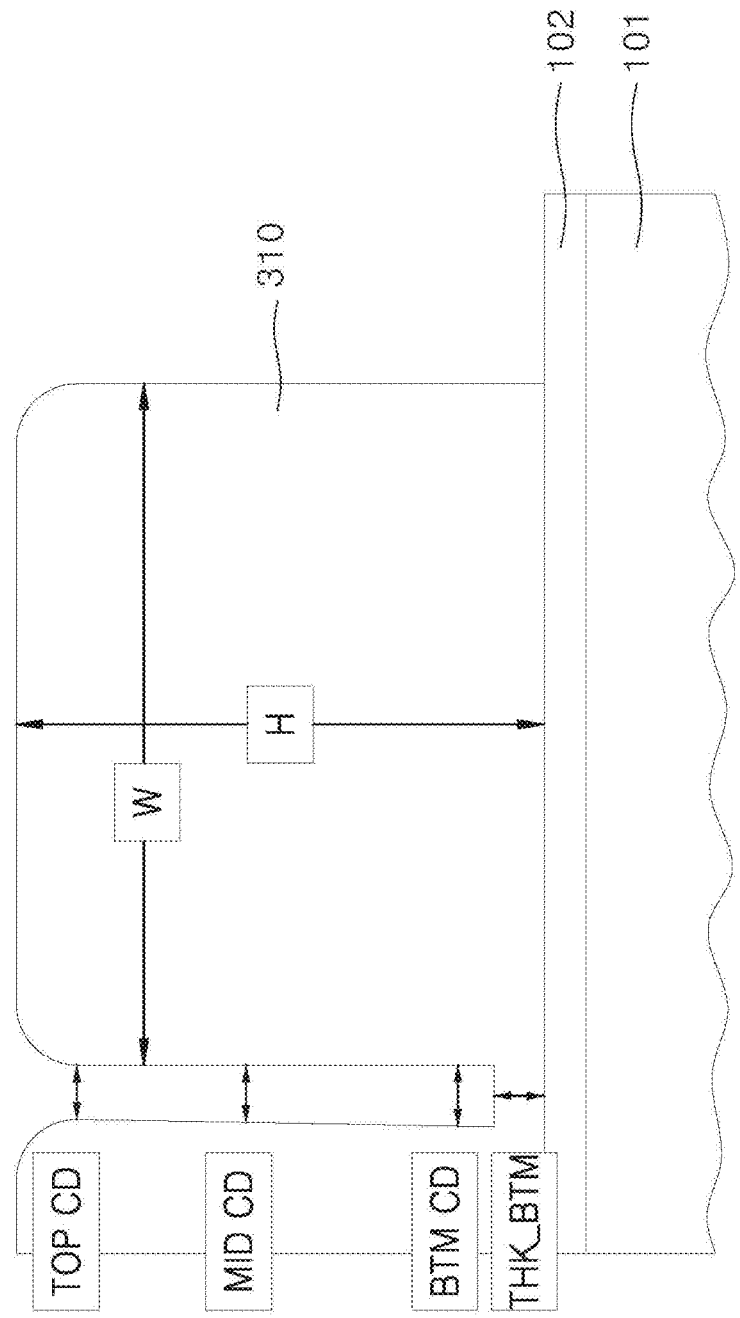
FIG. 9 shows what TOP, CD, MID CD, BTM CD and THK_BTM of Table 2.

Table 2 shows properties of the samples shown in FIG. 8. FIG. 9 shows what TOP, CD, MID CD, BTM CD and THK_BTM of Table 2, in a state where a film 310 having the photoresist pattern and the CD control film are formed on an oxide layer 102 that formed on the substrate 101.

TABLE 2

| Sample | TOP CD | MID CD | BTM CD | THK BTM | Footing Effect | Overhang |
| --- | --- | --- | --- | --- | --- | --- |
| SP #01 | 180 | 242 | 236 | 91 | X | X |
| SP #02 | 152 | 260 | 236 | 95 | X | ○ |
| SP #03 | 158 | 278 | 266 | 98 | X | ○ |

Referring to FIG. 8 and Table 2, in case of (a) of FIG. 8 to which a low plasma power is applied (i.e., SP #01), there is no overhang in the CD control film. However, in case of (b) of FIG. 8 (i.e., SP #02), a slight overhang occurred in the CD control film. In case of (c) of FIG. 8 to which a high plasma power is applied (i.e., SP #03), overhang remarkably occurred in the CD control film.

Based on FIG. 8 and Table 2, the plasma power applied in forming the CD control film in the PECVD process may be lower than 450 W, preferably, 200 to 400 W, more preferably, 250 to 350 W.

Figure 10:
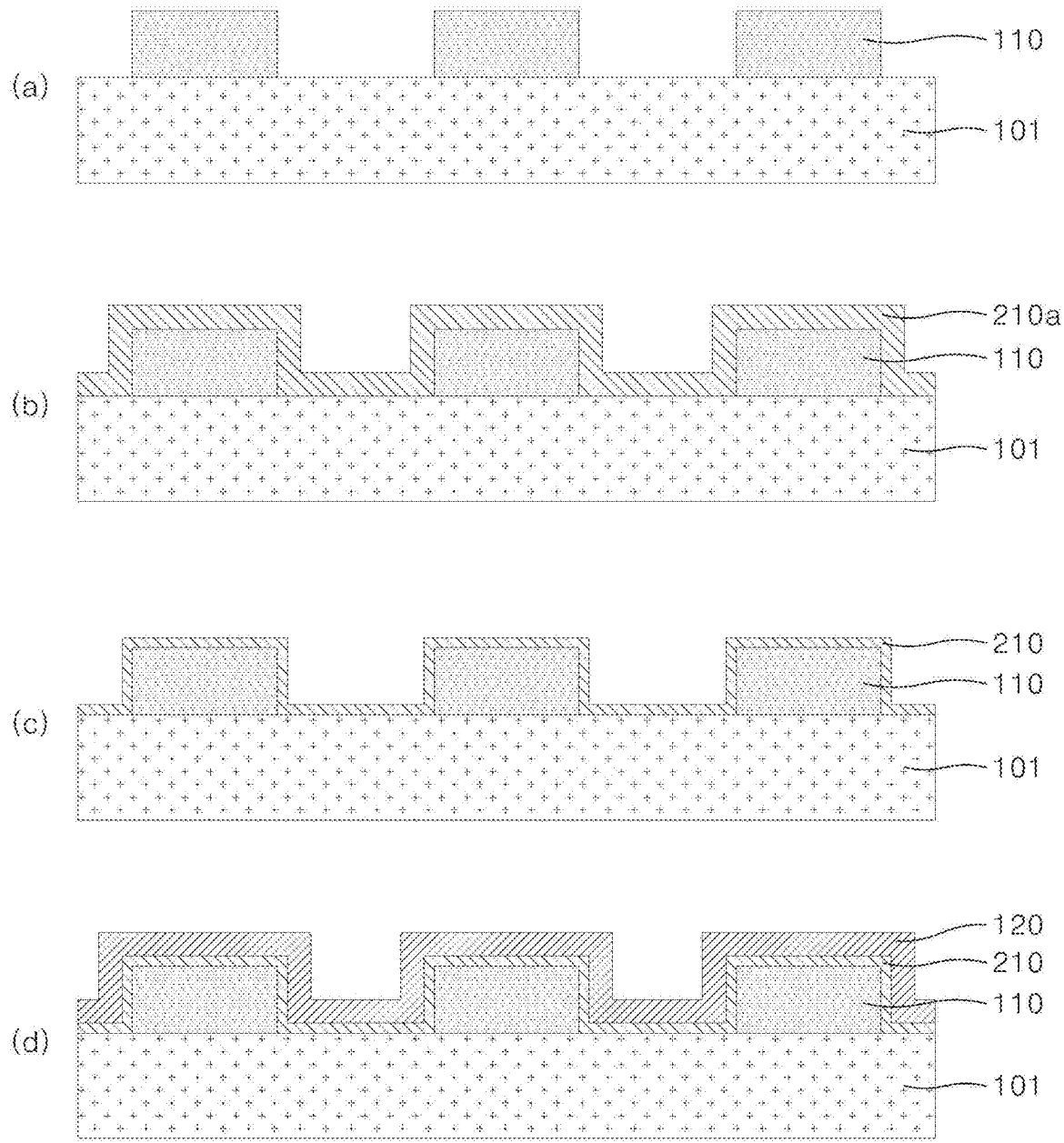
FIG. 10 shows another embodiment of forming a CD control film in a method of processing a substrate according to the present disclosure.

FIG. 10 shows another embodiment of forming a CD control film in a method of processing a substrate according to another embodiment of the present disclosure.

The method of processing the substrate according to this embodiment may include a photoresist pattern forming step, a seed layer forming step, a CD control film forming step, a subsequent process step and a CD control film and photoresist pattern removing step.

FIG. 10 schematically shows the photoresist pattern forming step, the seed layer forming step and the CD control film forming. The embodiment shown in FIG. 10 is similar to the embodiment shown in FIG. 5, except that a seed layer 210 is additionally formed before the CD control film is formed.

The seed layer 210 may serve as a barrier for suppressing damage to the photoresist pattern 110 on the substrate 101 due to plasma when the CD control film is deposited. In addition, the seed layer 210 may contribute to improving step coverage.

The seed layer 210 may be made of the same material as the CD control film 120, that is a nitrogen-doped amorphous carbon material. Both the seed layer 210 and the CD control film 120 may be formed inside one chamber. In this instance, the seed layer may be formed by vaporizing and depositing the liquid precursor at 100° C. or less, preferably, 75° C. to 100° C. by the PECVD process like the process condition for forming the CD control film. After the seed layer is formed, an inert gas plasma or nitrogen plasma treatment may be performed so that physical properties may be enhanced. The plasma power applied in the step of forming 210a the seed layer material 210a of (b) of FIG. 10 may be lower than the plasma power applied in the step of forming the CD control film 120 of (d) of FIG. 10.

The seed layer 210 may be formed with only deposition, but in order to control the thickness of the film, the seed layer forming step may include a step of depositing a seed material 210a as shown in FIG. 10(b) and a step of etching the seed layer material 210a to make the seed layer thinner as shown in FIG. 10(c).

Figure 11:
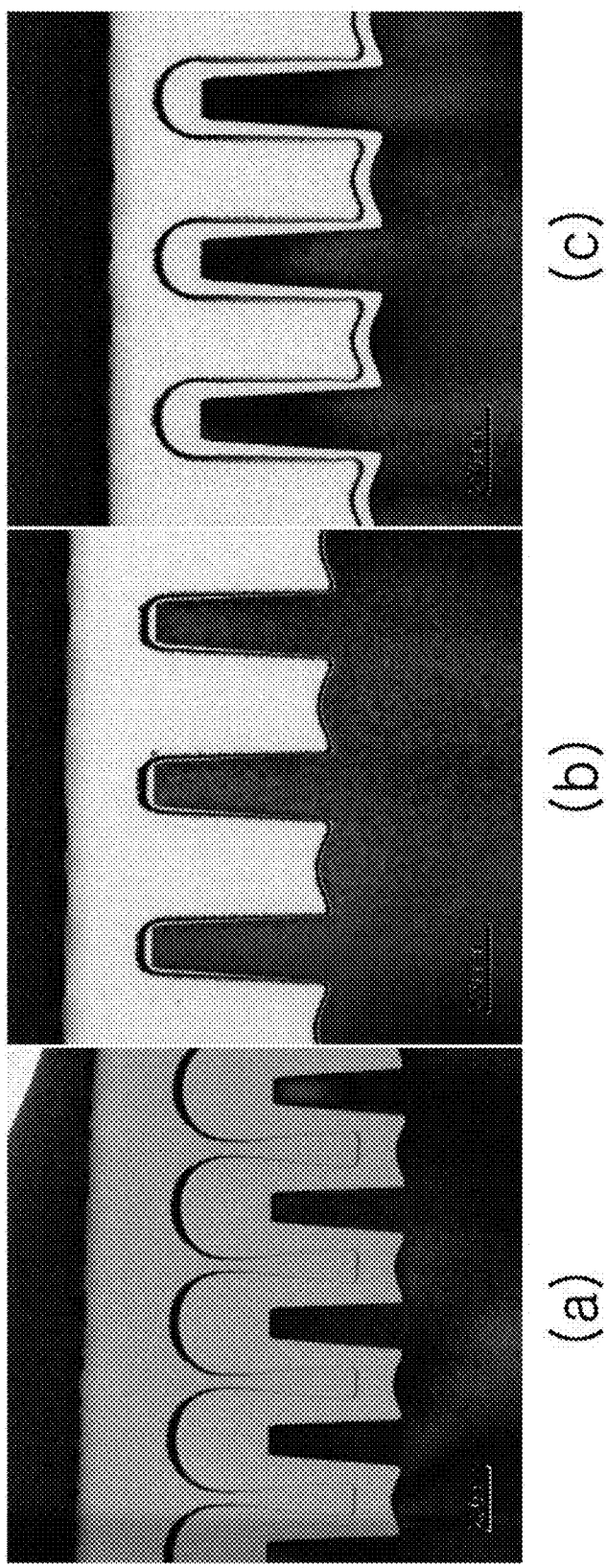
FIG. 11 is TEM images (a) when only a CD control film is formed, (b) when a seed layer is formed and etched, and (c) when a CD control film is formed after a seed layer is formed.

FIG. 11 is TEM images (a) when only a CD control film is formed, (b) when a seed layer is formed and etched, and (c) when a CD control film is formed after a seed layer is formed. As shown in FIG. 11, it is seen that the conformal properties are better when forming the seed layer.

As described above, the method of processing the substrate according to the present disclosure may form the CD control layer including nitrogen-doped amorphous carbon CD control film by the PECVD process using the hydrophilic liquid precursor at the process temperature of 100° C. or less. Accordingly, the present disclosure may have the effect of protecting the photoresist pattern during the subsequent ion implanting process as well as the effect of improving the conformal properties.

Although the present invention has been described with reference to the exemplified drawings, it is to be understood that the present invention is not limited to the embodiments and drawings disclosed in this specification, and those skilled in the art will appreciate that various modifications are possible without departing from the scope and spirit of the present invention. Further, although the operating effects according to the configuration of the present invention are not explicitly described while describing an embodiment of the present invention, it should be appreciated that predictable effects are also to be recognized by the configuration.

What is claimed is:

1. A method of processing a substrate comprising step of:
    disposing a substrate in a reaction chamber, the substrate on which a photoresist pattern is formed;
    forming a seed layer on the substrate on which the photoresist pattern is formed; and
    forming a CD control film including a nitrogen-doped amorphous carbon on the seed layer,
    wherein the step of forming the CD control film is performed at a temperature of 100° C. or less by a PECVD process.

2. The method of processing the substrate of claim 1, further comprising:
    a step of etching the seed layer to make the thickness of the seed layer thinner, before forming the CD control film.

3. The method of processing the substrate of claim 1, wherein the seed layer is formed at a temperature of 100° C. or less by a PECVD process.

4. The method of processing the substrate of claim 3, wherein a plasma power applied in the step of forming the seed layer is lower than a plasma power applied in the step of forming the CD control film.

5. The method of processing the substrate of claim 1, wherein the seed layer is made of the same material as the CD control film.

6. The method of processing the substrate of claim 1, wherein in the step of forming the seed layer and the step of forming the CD control film, a liquid precursor containing carbon and nitrogen is vaporized and supplied to the reaction chamber.

7. The method of processing the substrate of claim 1, wherein the step of forming the CD control film is performed from 75° C. to 100° C.

* * * * *